United States Patent
Kim et al.

(10) Patent No.: US 7,682,774 B2
(45) Date of Patent: Mar. 23, 2010

(54) RESIN COMPOSITION COMPRISING CATALYST PRECURSOR FOR ELECTROLESS PLATING TO FORM ELECTROMAGNETIC WAVE SHIELDING LAYER, METHODS FOR FORMING METAL PATTERNS USING THE RESIN COMPOSITION AND METAL PATTERNS FORMED BY THE METHODS

(75) Inventors: Min Kyoun Kim, Daejeon (KR); Min Jin Ko, Daejeon (KR); Bum Gyu Choi, Daejeon (KR); Sang Chul Lee, Daejeon (KR); Jeong Im Roh, Daejeon (KR)

(73) Assignee: LG Chem, Ltd., Seoul (KR)

( * ) Notice: Subject to any disclaimer, the term of this patent is extended or adjusted under 35 U.S.C. 154(b) by 98 days.

(21) Appl. No.: 11/785,080

(22) Filed: Apr. 13, 2007

(65) Prior Publication Data
US 2007/0243363 A1 Oct. 18, 2007

(30) Foreign Application Priority Data

Apr. 13, 2006 (KR) .................. 10-2006-0033757
Apr. 11, 2007 (KR) .................. 10-2007-0035607

(51) Int. Cl.
G03F 7/00 (2006.01)
C25D 5/54 (2006.01)

(52) U.S. Cl. ............. 430/281.1; 430/270.1; 430/285.1; 430/287.1; 430/618; 205/163; 205/167; 205/169

(58) Field of Classification Search .............. 430/270.1, 430/280.1, 285.1, 287.1, 311, 320, 322, 618, 430/281.1; 205/163, 167, 169; 427/96.3, 427/487

See application file for complete search history.

(56) References Cited

U.S. PATENT DOCUMENTS

| 4,900,618 | A | | 2/1990 | O'Connor et al. |
| 4,910,072 | A | | 3/1990 | Morgan et al. |
| 5,041,369 | A | * | 8/1991 | Fukui et al. .................. 430/619 |
| 5,387,493 | A | | 2/1995 | Imabayashi et al. |
| 5,994,034 | A | | 11/1999 | Maehata |

(Continued)

FOREIGN PATENT DOCUMENTS

EP 0 473 069 B1 6/1996

(Continued)

*Primary Examiner*—Thorl Chea
(74) *Attorney, Agent, or Firm*—McKenna Long & Aldridge LLP

(57) ABSTRACT

Disclosed is a resin composition which comprises a catalyst precursor for electroless plating to form an electromagnetic wave shielding layer. The resin composition comprises an organic polymer resin, a polyfunctional monomer having an ethylenically unsaturated bond, a photoinitiator, a silver organic complex precursor as a catalyst precursor, and an organic solvent. Further disclosed are methods for forming metal patterns using the resin composition and metal patterns formed by the methods. The methods comprise forming a pattern, reducing the pattern, and electroless plating the reduced pattern. A patterned layer of the catalyst formed using the resin composition is highly adhesive, a loss of the catalyst during a wet process is substantially prevented, and an increase in plating rate leads to the formation of a uniform, fine metal pattern after electroless plating. Electromagnetic wave shielding materials comprising the metal pattern can be used in the formation of films for shielding electromagnetic waves.

27 Claims, 5 Drawing Sheets

U.S. PATENT DOCUMENTS

2007/0036888 A1* 2/2007 Funaki et al. .............. 427/96.3

FOREIGN PATENT DOCUMENTS

| EP | 0 758 479 B1 | 5/1998 |
|---|---|---|
| JP | 54-126958 A | 10/1979 |
| JP | 02-223954 | 9/1990 |
| JP | 02-260691 | 10/1990 |
| JP | 02-285076 | 11/1990 |
| JP | 04-207000 | 7/1992 |
| JP | 2798053 | 7/1998 |
| JP | 10-223147 | 8/1998 |
| JP | 2005-353656 | 12/2005 |
| KR | 1991-0002491 | 4/1991 |
| KR | 1993-0004136 | 5/1993 |
| KR | 10-0221485 | 9/1999 |

* cited by examiner

RESIN COMPOSITION COMPRISING CATALYST PRECURSOR FOR ELECTROLESS PLATING TO FORM ELECTROMAGNETIC WAVE SHIELDING LAYER, METHODS FOR FORMING METAL PATTERNS USING THE RESIN COMPOSITION AND METAL PATTERNS FORMED BY THE METHODS

CLAIM OF PRIORITY

This application claims the benefit of Korean Patent Application No. 2006-33757 and filed on Apr. 13, 2006 and Korean Patent Application No. 2007-35607 filed on Apr. 11, 2007 respectively in the Korean Intellectual Property Office, the disclosure of which is incorporated herein by reference.

BACKGROUND OF THE INVENTION

1. Field of the Invention

The present invention relates to a resin composition comprising a catalyst precursor for electroless plating to form an electromagnetic wave shielding layer, methods for forming metal patterns using the resin composition, and metal patterns formed by the methods. More specifically, the present invention relates to a resin composition comprising a silver organic complex precursor as a catalyst precursor, methods for forming fine metal patterns using the resin composition, and metal patterns formed by the methods. The metal patterns of the present invention can be suitably used in the formation of films for shielding electromagnetic waves generated from the front surface of a variety of displays, including cathode ray tubes (CRTs), plasma display panels (PDPs), liquid crystal displays (LCDs) and electroluminescence (EL) displays, and in the wiring of flexible printed circuit boards.

2. Description of the Related Art

With the recent development and practical use of various types of displays, serious problems, such as hazards to human health and the malfunction of devices, have been encountered due to electromagnetic interference (EMI) noise generated from displays. In an attempt to solve these problems, an electrically conductive shielding film is formed on the front surface of a display to distort the propagation direction of electromagnetic waves generated from the display, followed by grounding to emit the electromagnetic waves.

Many methods are known to shield electromagnetic noise generated from the front surface of displays, including CRTs and PDPs, for example, by depositing a metal or metal oxide on a transparent substrate to form a conductive thin film. According to the exemplary method, however, since the conductive film must be formed as thin as possible to achieve transparency, the surface resistance of the conductive film is excessively increased, which makes it impossible to attain sufficient electromagnetic wave shielding effects.

In addition to these methods, methods have been reported wherein a conductive paste is patterned by a printing technique, such as screen printing or offset printing, and optionally the patterned paste is subjected to electroless plating to form an electromagnetic wave shielding film. However, there is a limitation in increasing the accuracy of printed circuits and there is a problem in that conductive materials infiltrate into irregular portions.

Further, some methods have been proposed wherein a metal layer is formed by photodevelopment and is subjected to electroplating or electroless plating to form an electromagnetic wave shielding film. However, drawbacks of these methods are that the photodevelopment requires the formation of several layers and the overall process is complicated. Further, methods have been reported wherein a metal catalyst is mixed with a photosensitive resin, the mixture is developed, followed by electroless plating and electroplating to form an electromagnetic wave shielding film. These methods, however, require the use of expensive palladium (Pd) as a catalyst and suggest no specific solution to avoid problems associated with the formation of a fine pattern and the electroless plating. Although the electroless plating is carried out to improve deposition characteristics, there is no specific approach to solve problems arising from detachment of the pattern in an aqueous solution of a strong base.

SUMMARY OF THE INVENTION

The present invention has been made to solve the foregoing problems of the prior art, and an aspect of the present invention is to provide a resin composition comprising a catalyst precursor that does not use an expensive Pd catalyst, is thermodynamically stable against oxidation due to reduction potential and is thus easy to handle, causes no significant loss of the catalyst during wet processes, such as development and electroless plating, and provides superior adhesiveness and deposition characteristics.

Another aspect of the present invention is to provide methods for forming metal patterns using the resin composition.

Another aspect of the present invention is to provide metal patterns formed by the methods.

Yet another aspect of the present invention is to provide an electromagnetic wave shielding material comprising one of the metal patterns.

According to a first aspect of the present invention, the present invention provides a resin composition for shielding electromagnetic waves, the resin composition comprising (a) an organic polymer resin, (b) a polyfunctional monomer having an ethylenically unsaturated bond, (c) a photoinitiator, (d) a silver organic complex precursor, and (e) an organic solvent.

According to a second aspect of the present invention, the present invention provides a method for forming a metal pattern, the method comprising (a) coating the resin composition on a substrate, (b) exposing the coated composition to light and developing the exposed composition to form a patterned layer of the catalyst, (c) reducing the patterned layer, and (d) subjecting the reduced layer to electroless plating.

According to a third aspect of the present invention, the present invention provides a method for forming a metal pattern, the method comprising (a) forming a patterned layer of the catalyst on a substrate with the resin composition, (b) reducing the patterned layer, and (c) subjecting the reduced layer to electroless plating.

According to a fourth aspect of the present invention, the present invention provides a metal pattern formed by a method comprising (a) coating the resin composition on a substrate, (b) exposing the coated composition to light and developing the exposed composition to form a patterned layer of the catalyst, (c) reducing the patterned layer, and (d) subjecting the reduced layer to electroless plating.

According to a fifth aspect of the present invention, the present invention provides a metal pattern formed by a method comprising (a) forming a patterned layer of the catalyst on a substrate with the resin composition, (b) reducing the patterned layer, and (c) subjecting the reduced layer to electroless plating.

According to a sixth aspect of the present invention, the present invention provides an electromagnetic wave shielding material comprising a metal pattern formed by one of the methods.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
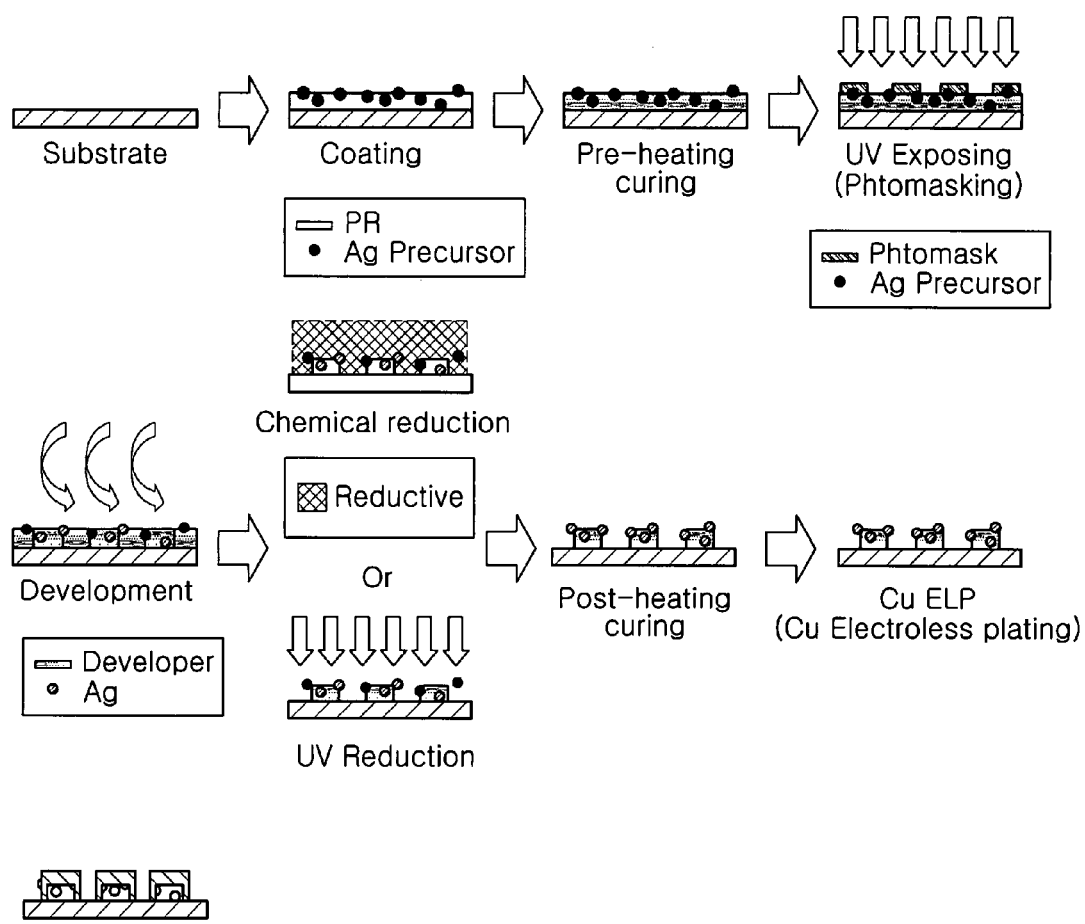
FIG. 1 is a process chart illustrating a method for forming a fine copper thin film by photomasking in accordance with the present invention.
Figure 2:
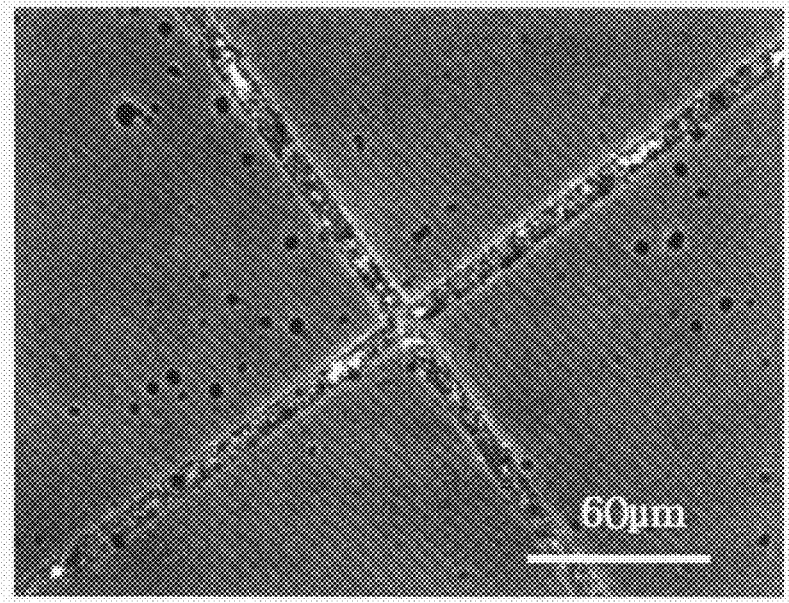
FIG. 2 is an optical micrograph (magnification 250×) of a metal pattern formed in Example 1 of the present invention.

Exemplary embodiments of the present invention will now be described in detail.

The present inventors have conducted research to develop a method for forming a fine metal pattern having a linewidth of 20 μm or less in a simple manner, and as a result, have found that when a resin composition comprising a silver organic complex precursor was used to form a pattern of the catalyst, the problem of poor stability of the resin composition arising from the use of metal particles was solved, a loss of silver as the catalyst during wet processing, such as development or plating, was decreased, and the adhesiveness, chemical resistance and deposition rate of a patterned layer of the catalyst are improved so that a uniform, fine metal pattern could be formed after electroless plating. The present invention has been achieved based on these findings.

In an embodiment of the present invention, there is provided a resin composition comprising an organic polymer resin, a polyfunctional monomer having an ethylenically unsaturated bond, a photoinitiator, a silver organic complex precursor as a catalyst precursor, and an organic solvent.

The organic polymer resin serves to stabilize the silver catalyst and to control the developablity of the catalyst. Generally, a large amount of the catalyst allows rapid electroless plating but is undesirable in terms of stability and developability.

Taking into consideration the stability and developability of the catalyst for electroless plating, as the organic polymer resin, a copolymer of a monomer having a carboxyl group and a monomer copolymerizable with the monomer having a carboxyl group may be used. The weight ratio of the monomer having a carboxyl group to the monomer copolymerizable with the monomer having a carboxyl group in the organic polymer resin may be in the range of 3:7 to 9:1, but is not limited to this range. When the content of the monomer having a carboxyl group is less than the lower limit defined above, the compatibility of the organic polymer resin with the catalyst is deteriorated and the solubility of the organic polymer resin in an alkaline developing solution is low, resulting in poor development. Meanwhile, when the content of the monomer having a carboxyl group exceeds the upper limit defined above, the solubility is too high, making it difficult to form a finely patterned layer of the catalyst.

The monomer having a carboxyl group is an unsaturated carboxylic acid. The unsaturated carboxylic acid may be selected from the group consisting of acrylic acid, methacrylic acid, crotonic acid, itaconic acid, maleic acid, fumaric acid, monomethylmaleic acid, isoprenesulfonic acid, styrenesulfonic acid, 5-norbornene-2-carboxylic acid, and mixtures thereof.

Examples of the monomer copolymerizable with the monomer having a carboxyl group include, but are not limited to, compounds having an unsaturated double bond. In view of the compatibility of the monomer with the metal catalyst, preferred are compounds having no aromatic functional group. Specifically, the monomer copolymerizable with the monomer having a carboxyl group may be selected from the group consisting of methyl methacrylate, ethyl 2-methylacrylate, isobutyl 2-methylacrylate, hexyl 2-methylacrylate, and mixtures thereof.

In view of an improvement in the adhesion of a catalyst-forming layer to a substrate and heat curability, an ethylenically unsaturated compound having an epoxy group may preferably be included in the organic polymer resin. More preferably, an ethylenically unsaturated compound having an epoxy group and a hydroxyl group may be included in the organic polymer resin.

To better form a finely patterned layer of the catalyst, the organic polymer resin has a weight average molecular weight of 2,000 to 30,000 and preferably 3,000 to 15,000. The use of the organic polymer resin having a weight average molecular weight of less than 2,000 results in deteriorated adhesive properties upon development and makes it difficult to form a finely patterned layer of the catalyst. Meanwhile, the use of the organic polymer resin having a weight average molecular weight of more than 30,000 lowers the solubility of the organic polymer resin in a developing solution, causing the possibility that no development may occur.

To better form a finely patterned layer of the catalyst, the organic polymer resin has an acid value of 90 to 700 mgKOH/g and preferably 300 to 570 mgKOH/g. When the organic polymer resin has an acid value lower than 90 mgKOH/g, its compatibility with the catalyst is deteriorated and the solubility of the organic polymer resin in an alkaline developing solution is lowered, causing the possibility of poor development. Meanwhile, when the organic polymer resin has an acid value higher than 700 mgKOH/g, the solubility of the organic polymer resin is too high, making it difficult to form a finely patterned layer of the catalyst.

The polyfunctional monomer having an ethylenically unsaturated bond is used to promote the photocurability of the resin composition, improve the developability of the resin composition, and improve the adhesiveness and chemical resistance of a patterned layer of the catalyst upon electroless plating. As the polyfunctional monomer having an ethylenically unsaturated bond, there may be mentioned, for example: a compound obtained by esterification of a polyhydric alcohol with an α,β-unsaturated carboxylic acid, e.g., ethylene glycol diacrylate, ethylene glycol dimethacrylate, polyethylene glycol diacrylate having 2 to 14 ethylene groups, polyethylene glycol dimethacrylate having 2 to 14 ethylene groups, trimethylolpropane triacrylate, trimethylolpropane trimethacrylate, pentaerythritol triacrylate, pentaerythritol trimethacrylate, pentaerythritol tetraacrylate, pentaerythritol tetramethacrylate, propylene glycol diacrylate having 2 to 14 propylene groups, propylene glycol dimethacrylate having 2 to 14 propylene groups, dipentaerythritol pentaacrylate, dipentaerythritol pentamethacrylate, dipentaerythritol hexaacrylate or dipentaerythritol hexamethacrylate; a compound obtained by adding acrylic acid or methacrylic acid to a glycidyl-containing compound, e.g., a trimethylolpropane triglycidyl ether acrylic acid adduct or a bisphenol A diglycidyl ether acrylic acid adduct; or an ester compound of multi-carboxylic acid with a compound having hydroxyl group and ethylenically unsaturated bond or multi-isocyanate adduct of a compound having hydroxyl group and ethylenically unsaturated bond, e.g., a phthalate of β-hydroxyethyl acrylate or β-hydroxyethyl methacrylate or a toluene diisocyanate adduct of β-hydroxyethyl acrylate or β-hydroxyethyl methacrylate. These multi-functional monomers may be used alone or as a mixture of two or more thereof.

In view of the shape of a finely patterned layer of the catalyst and the chemical resistance and adhesiveness of the patterned layer upon electroless plating, it is more preferred that the number of functional groups having an ethylenically unsaturated bond in the polyfunctional monomer be three or more.

The polyfunctional monomer having an ethylenically unsaturated bond is present in an amount of 20 to 150 parts by weight, based on 100 parts by weight of the organic polymer resin. If the polyfunctional monomer is present in an amount of less than 20 parts by weight, sufficient curing does not occur, which makes it difficult to form a fine pattern, and defects, such as dissolution and peeling, may occur upon electroless plating. Meanwhile, if the polyfunctional monomer is present in an amount of more than 150 parts by weight, coatability is deteriorated and internal curing does not uniformly occur, making it difficult to form a fine pattern of the catalyst.

There is no particular restriction as to the kind of the photoinitiator. For example, the photoinitiator may be selected from the group consisting of acetophenones, benzophenones, Michler's benzoylbenzoate, α-amyloxime ester, thioxanthones, triazines, and mixtures thereof.

Examples of suitable acetophenones include, but are not limited to, 2-benzyl-2-(dimethylamino)-1-[4-(4-morpholinyl)phenyl]-1-butanone (IRGACURE 369), α,α-dimethoxy-α-phenylacetopheone (IRGACURE 651), IRGACURE 1300 (IRGACURE 369 (30 wt %)+IRGACURE 651 (70 wt %)), 1-benzoylcyclohexanol, 2,2'-dimethoxy-2-phenyl-acetophenone (DMPA), 2,2-diethoxyacetophenone (DEAP), and 4-methylmercapto-α,α-dimethylmorpholino acetophenone. Examples of suitable benzophenones include, but are not limited to, 1-phenyl-1,2-propanedione-2-O-benzoyloxime (PPO), ethanone, and 1-[9-ethyl-6-(2-methylbenzoyl)-9H-carbazol-3-yl]-1-(O-acetyloxime) (CGI242). Examples of suitable thioxanthones include, but are not limited to, 2-chlorothio-xanthane and 2-isopropylthioxanthane. A non-limiting example of the triazines is 3-{4-[2,4-bis(trichloromethyl)-s-triazin-6-yl]phenylthio}propionic acid (TPA).

The photoinitiator is added in an amount of 1 to 25 parts by weight and preferably 5 to 20 parts by weight, based on 100 parts by weight of the organic polymer resin. When the photoinitiator is added in an amount of less than 1 part by weight, a patterned layer of the catalyst is not formed. Meanwhile, when the photoinitiator is added in an amount exceeding 25 parts by weight, the accuracy of the pattern is undesirably decreased.

If necessary, the resin composition of the present invention may further comprise a photosensitizer. The photosensitizer is added in an amount of 10 parts by weight or less and preferably 0.1 to 10 parts by weight, based on 100 parts by weight of a mixture of the organic polymer resin and the photoinitiator. When the photosensitizer is added in an amount exceeding 10 parts by weight, the accuracy of the pattern is undesirably decreased.

The photosensitizer may be selected from the group consisting of, but not limited to, n-butylamine, triethylamine, tri-n-butylphosphine, and mixtures thereof.

The silver organic complex precursor is added into the resin composition as a catalyst precursor and acts as a catalyst for electroless plating to form an electromagnetic wave shielding layer. The silver organic complex precursor is most preferably used in terms of stability, loss of the catalyst during wet processes, such as development and electroless plating, adhesive properties, plating characteristics upon electroless plating, and cost. When silver particles are used as catalyst particles, they are not homogeneously dispersed in a composition and tend to aggregate, which thus require the addition of a stabilizer, such as a surfactant, to the composition. Particularly, when the silver particles are used in an excessive amount, the developability of the catalyst is worsened, making it difficult to form a finely patterned layer of the catalyst, and the adhesiveness of the patterned layer may be deteriorated. On the other hand, when an inorganic silver salt is used as a catalyst, it may be dissolved in an aqueous solution, causing a loss of the catalyst upon electroless plating, and the adhesiveness of the patterned layer of the catalyst may be deteriorated, causing poor plating characteristics of the electroless plating.

It has been found that the use of the silver organic complex precursor leads to better stability, adhesiveness and deposition characteristics when compared to the use of an inorganic silver salt. A silver fluoride organic complex precursor is more preferably used. It is believed that since the silver fluoride organic complex precursor is highly compatible with the organic polymer resin and the organic solvent when compared to the silver organic complex precursor, a resin composition comprising the silver fluoride organic complex precursor is stable, the shape of a patterned layer of the catalyst is good, and the water solubility of the catalyst is low, causing no significant loss of the catalyst during wet processing. Moreover, the silver fluoride organic complex precursor is used to further enhance the adsorption of silver as the catalyst to a substrate in a basic aqueous solution as an electroless plating solution, thus enabling the formation of a uniformly deposited film. The term 'silver organic complex precursor' as used herein refers to a material acting as a catalyst after a special treatment, such as reduction.

Examples of preferred silver organic complex precursors that can be used in the present invention include, but are not limited to silver acetate complexes, silver sulfonate complexes, β-carbonyl ketone silver (I) complexes, and β-carbonyl ester silver (I) complexes. These silver organic complex precursors may be used alone or as a mixture of two or more thereof.

Examples of the silver acetate complexes and silver sulfonate complexes include, but are not limited to, silver acetate, silver lactate, silver myristate, silver citrate, silver benzoate, silver phenylacetate, silver cyclohexanebutyrate, silver p-toluenesulfonate, silver oxalate, silver malonate, silver succinate, and silver adipate. As the silver fluoride organic complex, there may be used, for example, silver (I) fluorosulfate, silver (I) trifluoroacetate, silver (I) trifluoromethanesulfate, silver (I) pentafluoropropionate, or silver (I) heptafluorobutyrate.

Examples of the β-carbonyl ketone silver (I) complexes and β-carbonyl ester silver (I) complexes include, but are not limited to, silver (I) acetylacetonate, 3-chloro-2,4-pentanedionato silver (I), 3,5-heptanedionato silver (I), 2-acetylcyclohexanonato silver (I), 3-ethyl-2,4-pentadionato silver (I), benzoylacetone silver (I), dibenzoylmethane silver (I), 2,2,6,6-tetramethylheptanediene silver (I), ethylacetoacetate silver (I), methylacetoacetate silver (I), isopropylacetoacetate silver (I) and tert-arylbutylacetoacetate silver (I) complexes. Examples of suitable silver fluoride organic complexes include 1,5-cyclooctadiene-hexafluoroacetylacetonato silver (I), 1,1,1-trifluoro-2,4-pentadionato silver (I), 5,5-dimethyl-1,1,1-trifluoro-2,4-hexanedionato silver (I), 1-(4-methoxyphenyl)-4,4,4-trifluorobutanedionato silver (I), 5,5,6,6,7,7,8,8,9,9,10,10,11,11,12,12,12-heptadecafluorodecane-2,4-dionato silver (I), 1,1,1,2,2,3,3-heptafluoro-7,7-dimethyl-4,6-octanedionato silver (I), 1,1,1,3,5,5,5-heptafluoropentane-2,4-dionato silver (I), 1,1,1,5,5,5-hexafluoropentane-2,4-dionato silver (I), 5,5,6,6,7,7,8,8,8-nonafluorooctane-2,4-dionato silver (I), 5H,5H-perfluorononane-4,6-dionato silver (I), 6H,6H-perfluoro-undecane-5,7-dionato silver (I), 8H,8H-perfluoropentadecane-7,8-dionato silver (I), 6H,6H-perfluoroundecane-5,7-dionato silver (I), 1-phenyl-2H,2H-perfluorohexane-1,3-dionato silver (I), 1-phenyl-2H, 2H-perfluoroundecane-1,3-dionato silver (I), 5,6,6,6-tetrafluoro-5-(heptafluoropropoxy)hexane-2,4-dionato silver (I), 1,1,5,5-tetrafluoropentane-2,4-dionato silver (I), 5,5,6,6,7,7,8,8,9,9,9-undecanefluoro-nonane-2,4-dionato silver (I), ethyl-3-chloro-4,4,4-trifluoroacetoacetato silver (I), ethyl-4,4-difluoroacetoacetato silver (I), ethyl-4,4,4-trifluoroacetoacetato silver (I), isopropyl-4,4,4-trifluoroacetoacetato silver (I), methyl-4,4,5,5,5-pentafluoro-3-oxopentanonato silver (I), ethyl-4,4,5,5,5-pentafluoro-3-oxo-pentanonato silver (I) and 1,1,1,5,5,6,6,6-octafluoro-2,4-hexanedionato silver (I) complexes. These silver fluoride organic complexes may be used alone or as a mixture of two or more thereof.

The silver organic complex precursor may be used in an amount of 2 to 80 parts by weight and preferably 5 to 60 parts by weight, based on 100 parts by weight of the total organic solids of the resin composition. When the content of the silver organic complex precursor in the resin composition of the present invention is less than 2 parts by weight, the amount of the catalyst is insufficient, thus lengthening the time required to form a metal film upon electroless plating and making it difficult to form a homogeneous film. Meanwhile, when the content of the silver organic complex precursor in the resin composition of the present invention is more than 80 parts by weight, the developability of the catalyst is worsened, which makes it difficult to form a uniform, fine pattern of the catalyst having a linewidth of 20 μm or less, and the adhesive properties are deteriorated, which makes it difficult to form a metal layer of a fine pattern.

Examples of suitable organic solvents include, but are not specially limited to: alcohols, e.g., methanol, ethanol, n-propanol, isopropanol, ethylene glycol and propylene glycol; ketones, e.g., acetone, methyl ethyl ketone, cyclohexanone and n-methyl-2-pyrrolidone; aromatic hydrocarbons, e.g., toluene, xylene and tetramethylbenzene; glycol ethers, e.g., cellosolve, methyl cellosolve, ethyl cellosolve, 3-methoxypropyl acetate, propylene glycol monomethyl ether, propylene glycol ethyl ether, dipropylene glycol monomethyl ether and dipropylene glycol ethyl ether; and acetates, e.g., ethyl acetate, butyl acetate, cellosolve acetate, ethyl cellosolve acetate, butyl cellosolve acetate, propylene glycol monomethyl ether acetate and propylene glycol ethyl ether acetate. These solvents may be used alone or as a mixture of two or more thereof.

If needed, the resin composition of the present invention may further comprise at least one additive selected from wetting agents and adhesion enhancers that are commonly used in the art.

The resin composition of the present invention may have a solids content of 10 to 50% by weight. When the solids content is higher than 50% by weight, the resin composition is highly viscous and is thus uniformly coated on a substrate. Meanwhile, when the solids content is lower than 10% by weight, the thickness of a thin film to be formed is small, resulting in poor mechanical strength of the thin film.

In a further embodiment of the present invention, there is provided a method for forming a metal pattern which comprises coating the resin composition on a substrate, exposing the coated composition to light and developing the exposed composition to form a patterned layer of the catalyst, reducing the patterned layer, and subjecting the reduced layer to electroless plating.

In another embodiment of the present invention, there is provided a method for forming a metal pattern which comprises printing the resin composition on a substrate to form a patterned layer of the catalyst, reducing the patterned layer, and subjecting the reduced layer to electroless plating.

A transparent substrate is preferably used to produce a transparent electromagnetic wave shielding material. Specific examples of the transparent substrate include glass substrates, and plastic sheets and films made of polycarbonate, acrylic resins, PET, triacetyl cellulose (TAC), polyvinyl chloride resins, polyamide resins and polyimide resins. Various factors (such as bump thickness, etc.) of other substrates are not particularly restricted so long as they are generally recognized in the art.

Processes for coating the catalyst-forming composition of the present invention on the substrate are not particularly limited and vary depending on the characteristics and amount of the solution applied. Any known coating process may be employed to coat the composition, and examples thereof include roll coating, gravure coating, dip coating, bar coating, spray coating and spin coating.

The light exposure and development may be performed by any known process. For example, the light exposure may be performed using a mask having an exposure pattern by a contact or non-contact process. Any known light source may be used for the light exposure, and examples thereof include halogen lamps, high-pressure mercury lamps, and metal halide lamps. The development may be performed by spraying or dipping. The light exposure and the development are performed to form a patterned layer of the catalyst. The patterned layer thus formed has a linewidth of 30 μm or less and preferably 20 μm or less. The use of the resin composition, i.e. the catalyst-forming composition according to the present invention enables the formation of a fine pattern having a linewidth of 10 μm or less. After the light exposure, the ratio (i.e. opening ratio) of unpatterned areas to the total surface area of the patterned layer is suitably 60% or above and more preferably 70% or above.

Alternatively, a metal pattern may be formed by printing the resin composition of the present invention on a substrate to form a patterned layer of the catalyst, reducing the patterned layer, and subjecting the reduced layer to electroless plating. The printing is performed by a technique selected from the group consisting of offset printing, inkjet printing, imprinting, and screen printing.

In the forming of a patterned layer of the catalyst in the present invention by the light exposure and the development or by printing, the silver organic complex precursor is allowed to be reduced to improve the electroless plating characteristics.

Methods for the reduction of the silver organic complex precursor are not particularly limited. For example, the silver organic complex precursor may be reduced using a reducing agent or by heat and/or UV irradiation. Any known reducing agent may be used, and examples thereof include sodium borohydride ($NaBH_4$) and an aqueous solution of ascorbic acid.

Depending on the kind of the silver organic complex, the patterned layer may be spontaneously reduced by an electroless plating solution. However, since the reduction of the silver organic complex using an electroless plating solution is not satisfactory, an additional reduction process of the silver ions is required.

An aqueous solution of the reducing agent preferably has a concentration of 0.01 M to 1.0 M, and is used to reduce the silver organic complex by a spraying or dipping process. Since the reduction process of the silver organic complex by UV irradiation or heat is not a wet process, a loss of the catalyst is preferably prevented. When the aqueous solution of the reducing agent has a concentration lower than 0.01 M, the reducing power of the reducing agent is insufficient and thus the silver organic complex precursor is not satisfactorily reduced. Meanwhile, when the aqueous solution of the reducing agent has a concentration higher than 1.0 M, the degree of reduction is not readily controlled and there is a danger of damage to the patterned layer.

If desired, the coated composition may be subjected to pre-heat curing or post-heat curing in the course of producing a metal pattern in the method of this invention. Since the pre-heat curing and the post-heat curing are optionally conducted by any process known in the art, they do not serve to limit the present invention.

As explained above, the resin composition of the present invention is used to form the patterned layer of the catalyst, which is then subjected to electroless plating to form a metal pattern. The electroless plating is carried out by any general technique known in the art. Copper or silver plating may be carried out in the present invention. Copper plating is preferred in terms of cost and electromagnetic wave shielding performance.

Electroless copper plating may be carried out using any general plating solution known in the art, for example, a plating solution containing a metal ion salt (e.g., copper sulfate), a reducing agent (e.g., formalin), a complexing agent (e.g., EDTA), and slight amounts of one or more additives.

The total thickness of the patterned layer of the catalyst and the metal layer in a final electromagnetic wave shielding film comprising the metal pattern may be controlled by varying various factors, such as the concentration of a metal salt or metal ions in the plating solution, the plating temperature and the deposition time. The thickness of the patterned layer of the catalyst and/or the metal layer can be varied in response to a variation in the thickness of the pattern. Optimal thicknesses of the patterned layer of catalyst and/or the metal layer may be appropriately determined by those skilled in the art. The total thickness of the patterned layer of catalyst and the metal layer is 0.3 µm or above, preferably 0.5 µm or above, more preferably 1 µm or above, and most preferably 1 µm to 8 µm, but is not limited thereto. When the total thickness of the patterned layer of catalyst and the metal layer is below 0.3 µm, the mechanical strength and conductivity of the layers are not satisfactory, and as a result, the shielding characteristics of the final electromagnetic wave shielding film may be deteriorated. Meanwhile, when the total thickness of the patterned layer of catalyst and the metal layer is above 8 µm, subsequent processing cannot be executed properly. It is preferred that the metal layer preferably have a minimum thickness of 0.1 µm (100 nm) in terms of conductivity and electromagnetic wave shielding performance.

In conclusion, since a highly adhesive patterned layer of the catalyst is formed using the resin composition of the present invention, a loss of the catalyst during a wet process, such as development or electroless plating, is substantially prevented and an increase in plating rate leads to the formation of a uniform, fine metal pattern after electroless plating. Electromagnetic wave shielding materials comprising the metal pattern can be suitably used in the formation of films for shielding electromagnetic waves generated from the front surface of a variety of displays, including CRTs, PDPs, LCDs and EL displays, and in the wiring of flexible printed circuit boards.

Hereinafter, the present invention will be explained in more detail with reference to the following examples. However, these examples are not intended to limit the present invention.

EXAMPLES

Example 1

A. Preparation of Organic Polymer Resin (1) and Blend (2) used to Prepare Resin Composition using the Organic Polymer Resin (1) 15.0 g of methyl methacrylate (MMA) and 15.0 g of methacrylic acid (MAA) were dissolved in 75.4 g of dipropylene glycol monomethyl ether (DPM) in a 250 mL flask, and then 0.9 g of 3-mercaptopropionic acid (3-MPA) was added thereto. The mixture was stirred at 500 rpm. After the resulting solution was heated to 60° C. under a nitrogen atmosphere, it was stirred for one hour. To the solution at 60° C. was added a solution of 2,2'-azobisisobutyronitrile (AIBN, 0.9 g) in DPM (10.0 g). The resulting mixture was allowed to react at 60° C. for 3 hours to obtain a solution of an organic polymer resin. The organic polymer resin was found to have an acid value of 348.77 mgKOH/g and a weight average molecular weight of 7,933.

(2) 5.81 g of the polymer resin solution, 2.68 g of a solution of dipentaerythritol hexaacrylate (DPHA) (50 wt % in PGMEA), 0.185 g of 3-{4-[2,4-bis(trichloromethyl)-s-triazin-6-yl]phenylthio}propionic acid (TPA) as a photoinitiator were mixed together, and then the mixture was mixed with 6.23 g of propylene glycol monomethyl ether acetate (PG-MEA) as a solvent to obtain a blend, which was used to prepare a resin composition in the subsequent step.

B. Preparation of Silver Organic Complex 1 g of silver acetate (AgOAc) was mixed with 10 g of dimethylacetamide (DMAC) as an organic solvent at room temperature. The mixture was stirred at 500 rpm. To the mixture was added 2.5 g of 1,1,1-trifluoro-2,4-pentadione. The silver acetate was complexed with the 1,1,1-trifluoro-2,4-pentadione to form a yellow solution, which was sufficiently dissolved in the dimethylacetamide (DMAc). The solution was passed through a 0.20 µm syringe filter to obtain a solid. The solid was used as a catalyst precursor. The formation reaction of the catalyst precursor by complexation is shown in the following Reaction 1:

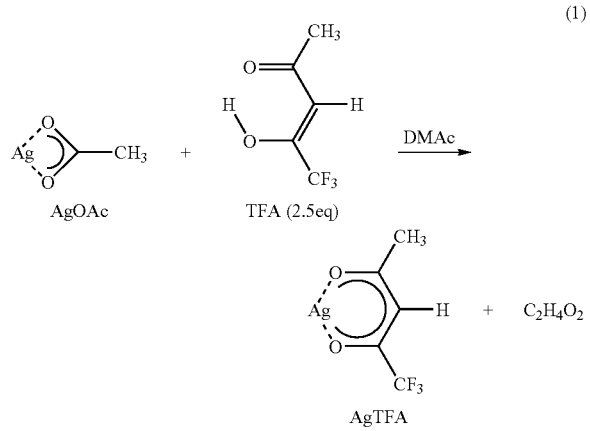

AgOAc + TFA (2.5eq) →(DMAc) AgTFA + C₂H₄O₂

C. Preparation of Resin Composition

The silver organic complex was mixed with the blend in a weight ratio of 2:1. The mixture was stirred using a stirrer at 500 rpm to prepare a resin composition. The solids content of the resin composition was measured to be 16.5% by weight.

D. Formation of Fine Metal Pattern (1) Coating: The resin composition was spin-coated on a glass substrate having a thickness of 700 μm. The coating was conducted sequentially at 1,500 rpm for 10 seconds and at 3,000 rpm for 20 seconds.

(2) Preheat curing: The coated composition was subjected to preheat curing at 100° C. for 90 seconds.

(3) Light exposure: The cured composition was irradiated with ultraviolet light with an energy of 180 mJ/cm² and a wavelength of 330 nm to 500 nm through a photomask (20 μm mesh pattern) by a contact process.

(4) Development: A basic aqueous solution (pH 13, ECD-100, ENF) was sprayed on the exposed composition for 72 seconds, cleaned with deionized water (DI), and blown with nitrogen.

(5) Reduction: The developed composition was dipped in a 0.1 M aqueous solution of ascorbic acid for 120 seconds, and cleaned with deionized water (DI) to reduce the silver catalyst.

(6) Post-heat curing: Post heat curing was conducted at 100° C. for 300 seconds.

(7) Electroless copper plating: Electroless plating was carried out in a Covertron copper bath (ATOTECH) at 60° C.

Example 2

Figure 3:
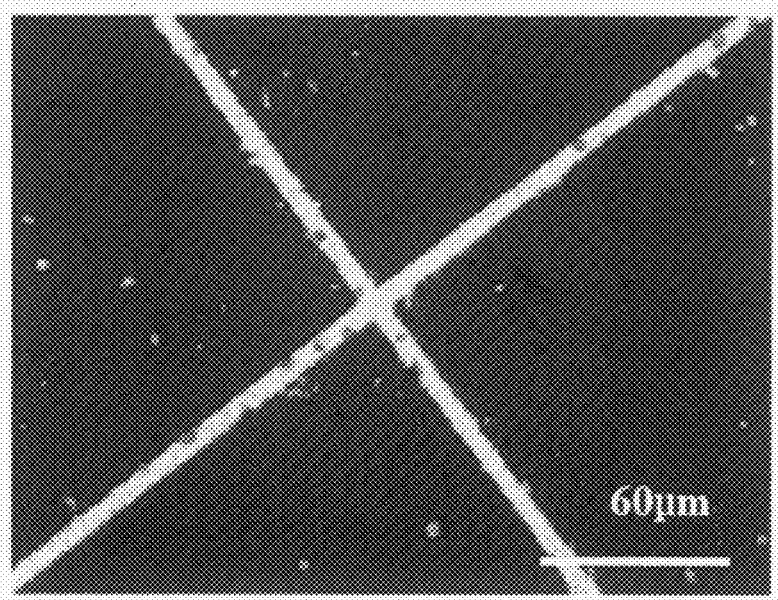
FIG. 3 is an optical micrograph (magnification 250×) of a metal pattern formed in Example 2 of the present invention.

A metal pattern was formed in the same manner as in Example 1, except that the irradiation was performed with ultraviolet light with an energy of 3.9 J/cm² and a wavelength of 330 nm to 500 nm to reduce the silver organic compound. An optical micrograph (magnification 250×) of the metal pattern is shown in FIG. 3.

Example 3

A. Preparation of Organic Polymer Resin (1) and Blend (2) used to Prepare Resin Composition using the Organic Polymer Resin (1) 9.0 g of methyl methacrylate (MMA) and 21.0 g of methacrylic acid (MAA) were dissolved in 75.4 g of DPM in a 250 mL flask, and then 0.9 g of 3-mercaptopropionic acid (3-MPA) was added thereto. The mixture was stirred at 500 rpm. After the resulting solution was heated to 60° C. under a nitrogen atmosphere, it was stirred at 500 rpm for one hour. To the solution at 60° C. was added a solution of α,α'-azobisisobutyronitrile (AIBN, 0.9 g) in DPM (10.0 g). The resulting mixture was allowed to react at 60° C. for 3 hours to obtain a solution of an organic polymer resin. The organic polymer resin was found to have an acid value of 452.32 mgKOH/g and a weight average molecular weight of 6,423.

(2) 5.81 g of the polymer resin solution, 2.68 g of a solution of dipentaerythritol hexaacrylate (DPHA) (50 wt % in PGMEA), 0.185 g of 3-{4-[2,4-bis(trichloromethyl)-s-triazin-6-yl]phenylthio}propionic acid (TPA) as a photoinitiator were mixed together, and then the mixture was mixed with 6.23 g of PGMEA as a solvent to obtain a blend, which was used to prepare a resin composition in the subsequent step.

B. Preparation of Resin Composition

The silver organic complex prepared in Example 1 was mixed with the blend prepared in A(2) of Example 3 in a weight ratio of 2:1. The mixture was stirred using a stirrer at 500 rpm to prepare a resin composition. The solids content of the resin composition was measured to be 16.5% by weight.

C. Formation of Fine Metal Pattern

Figure 4:
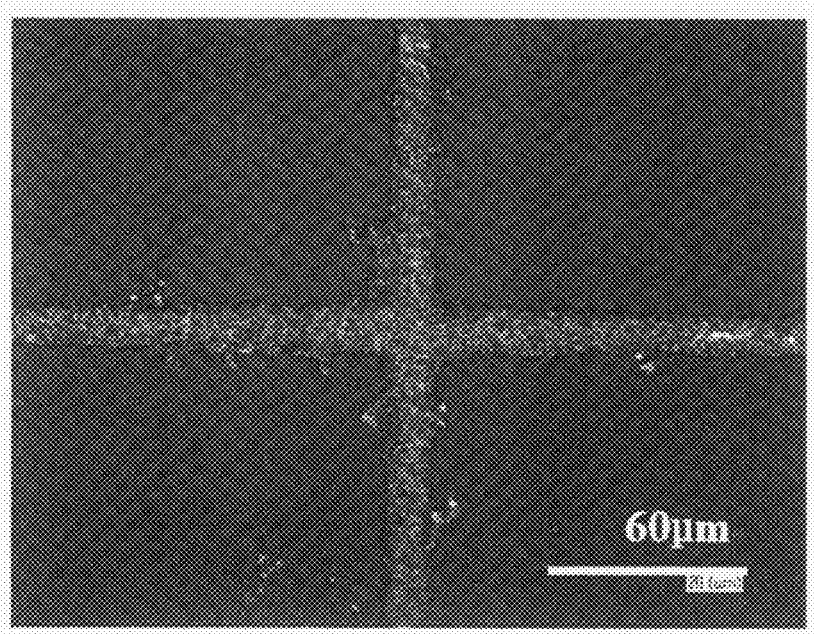
FIG. 4 is an optical micrograph (magnification 250×) of a metal pattern formed in Example 3 of the present invention.

A metal pattern was formed on a substrate in the same manner as in Example 2, except that the resin composition prepared in B of Example 3 was used. An optical micrograph (magnification 250×) of the metal pattern is shown in FIG. 4.

Example 4

A. Preparation of Organic Polymer Resin (1) and Blend (2) used to Prepare Resin Composition using the Organic Polymer Resin (1) 3.0 g of methyl methacrylate (MMA) and 27.0 g of methacrylic acid (MAA) were dissolved in 75.4 g of DPM in a 250 mL flask, and then 0.9 g of 3-mercaptopropionic acid (3-MPA) was added thereto. The mixture was stirred at 500 rpm. After the resulting solution was heated to 60° C. under a nitrogen atmosphere, it was stirred at 500 rpm for one hour. To the solution at 60° C. was added a solution of AIBN (0.9 g) in DPM (10.0 g). The resulting mixture was allowed to react at 60° C. for 3 hours to obtain a solution of an organic polymer resin. The organic polymer resin was found to have an acid value of 576.69 mgKOH/g and a weight average molecular weight of 4,032.

(2) 5.81 g of the polymer resin solution, 2.68 g of a solution of dipentaerythritol hexaacrylate (DPHA) (50 wt % in PGMEA), 0.185 g of 3-{4-[2,4-bis(trichloromethyl)-s-triazin-6-yl]phenylthio}propionic acid (TPA) as a photoinitiator were mixed together, and then the mixture was mixed with 6.23 g of PGMEA as a solvent to obtain a blend, which was used to prepare a resin composition in the subsequent step.

B. Preparation of Resin Composition

The silver organic complex prepared in Example 1 was mixed with the blend prepared in A(2) of Example 4 in a weight ratio of 2:1. The mixture was stirred using a stirrer at 500 rpm to prepare a resin composition. The solids content of the resin composition was measured to be 16.5% by weight.

C. Formation of Fine Metal Pattern

Figure 5:
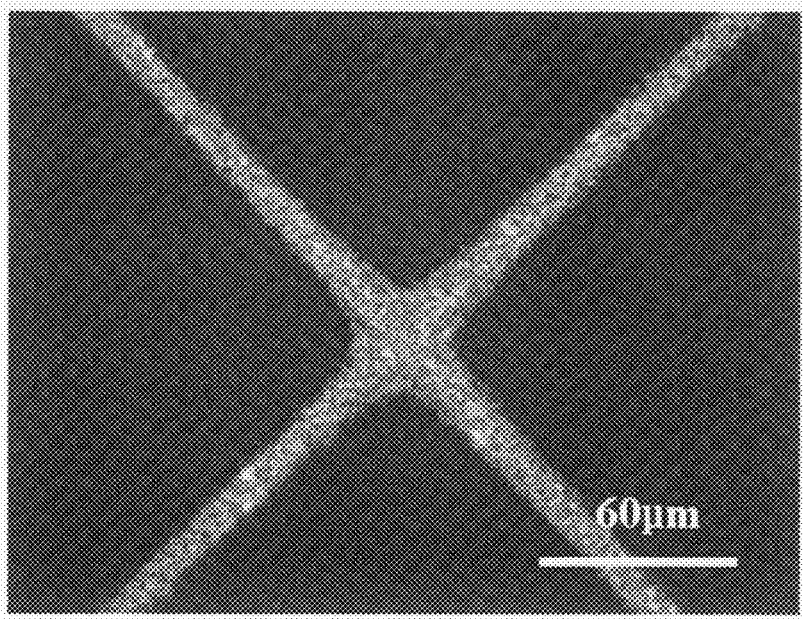
FIG. 5 is an optical micrograph (magnification 250×) of a metal pattern formed in Example 4 of the present invention.

A metal pattern was formed on a substrate in the same manner as in Example 2, except that the resin composition prepared in B of Example 4 was used. An optical micrograph (magnification 250×) of the metal pattern is shown in FIG. 5.

Example 5

Figure 6:
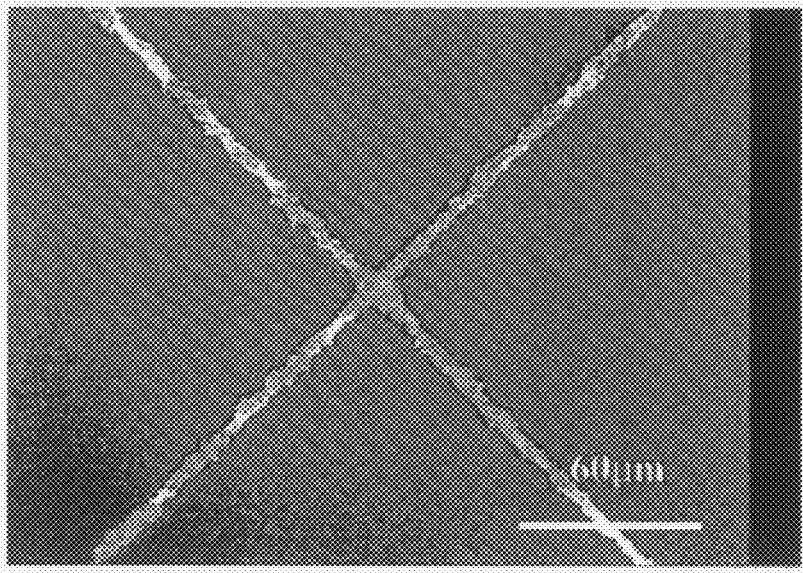
FIG. 6 is an optical micrograph (magnification 250×) of a metal pattern formed in Example 5 of the present invention.

A metal pattern was formed on a substrate in the same manner as in Example 1, except that 1 g of silver acetylacetonate was mixed with 11.533 g of dimethylacetamide (DMAc) at room temperature to form a silver organic complex, and the mixture was passed through a 0.20 µm syringe filter to obtain a solid, which was used as a catalyst precursor. An optical micrograph (magnification 250x) of the metal pattern is shown in FIG. 6.

Comparative Example 1

A. Preparation of Organic Polymer Resin (1) and Blend (2) used to Prepare Resin Composition using the Organic Polymer Resin (1) 9.0 g of methyl methacrylate (MMA) and 21.0 g of methacrylic acid (MAA) were dissolved in 75.4 g of DPM in a 250 mL flask, and then 0.9 g of 3-mercaptopropionic acid (3-MPA) was added thereto. The mixture was stirred at 500 rpm. After the resulting solution was heated to 60° C. under a nitrogen atmosphere, it was stirred at 500 rpm for one hour. To the solution at 60° C. was added a solution of AIBN (0.9 g) in DPM (10.0 g). The resulting mixture was allowed to react at 60° C. for 3 hours to obtain a solution of an organic polymer resin. The organic polymer resin was found to have an acid value of 452.32 mgKOH/g and a weight average molecular weight of 5,423. The organic polymer solution was heated to 80° C., stirred under an oxygen atmosphere for 30 minutes, and heated to 90° C. To the solution at 90° C. was added a solution of dimethylaminopyridine (DMAP, 0.15 g) in a solvent (3 g). After the resulting solution was heated to 110° C., 7.44 g glycidyl methacrylate (GMA) was added and stirred for 6 hours. The reaction solution was allowed to cool to room temperature to obtain a solution of a polymer resin. The polymer resin was found to have an acid value of 123.74 mgKOH/g and a weight average molecular weight of 11,635.

(2) 5.81 g of the polymer resin solution, 2.68 g of a solution of dipentaerythritol hexaacrylate (DPHA) (50 wt % in PGMEA), 0.185 g of 3-{4-[2,4-bis(trichloromethyl)-s-triazin-6-yl]phenylthio}propionic acid (TPA) as a photoinitiator were mixed together, and then the mixture was mixed with 6.23 g of PGMEA as a solvent to obtain a blend, which was used to prepare a resin composition in the subsequent step.

B. Preparation of Catalyst Precursor 1 g of silver nitrate ($AgNO_3$) was mixed with 1 g of dimethylformamide (DMF) with stirring at 500 rpm at room temperature, and the solution was passed through a 0.20 µm syringe filter to obtain a solid, which was used as a catalyst precursor.

C. Preparation of Resin Composition

The blend prepared in A(2) of Comparative Example 1 was mixed with the catalyst precursor prepared in B of Comparative Example 1 in a weight ratio of 1:1 with stirring using a stirrer at 500 rpm to prepare a resin composition. The solids content of the resin composition was measured to be 16.5% by weight.

D. Formation of Fine Metal Pattern

Figure 7:
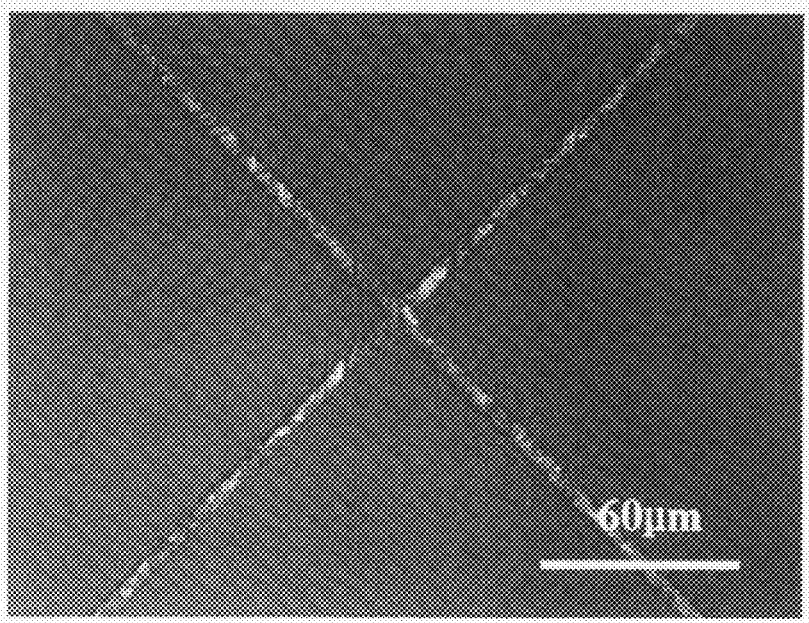
FIG. 7 is an optical micrograph (magnification 250×) of a metal pattern formed in Comparative Example 1 of the present invention.

A fine metal pattern was formed in the same manner as in Example 1, except that the resin composition prepared in C of Comparative Example 1 was used. An optical micrograph (magnification 250x) of the metal pattern is shown in FIG. 7.

Comparative Example 2

Figure 8:
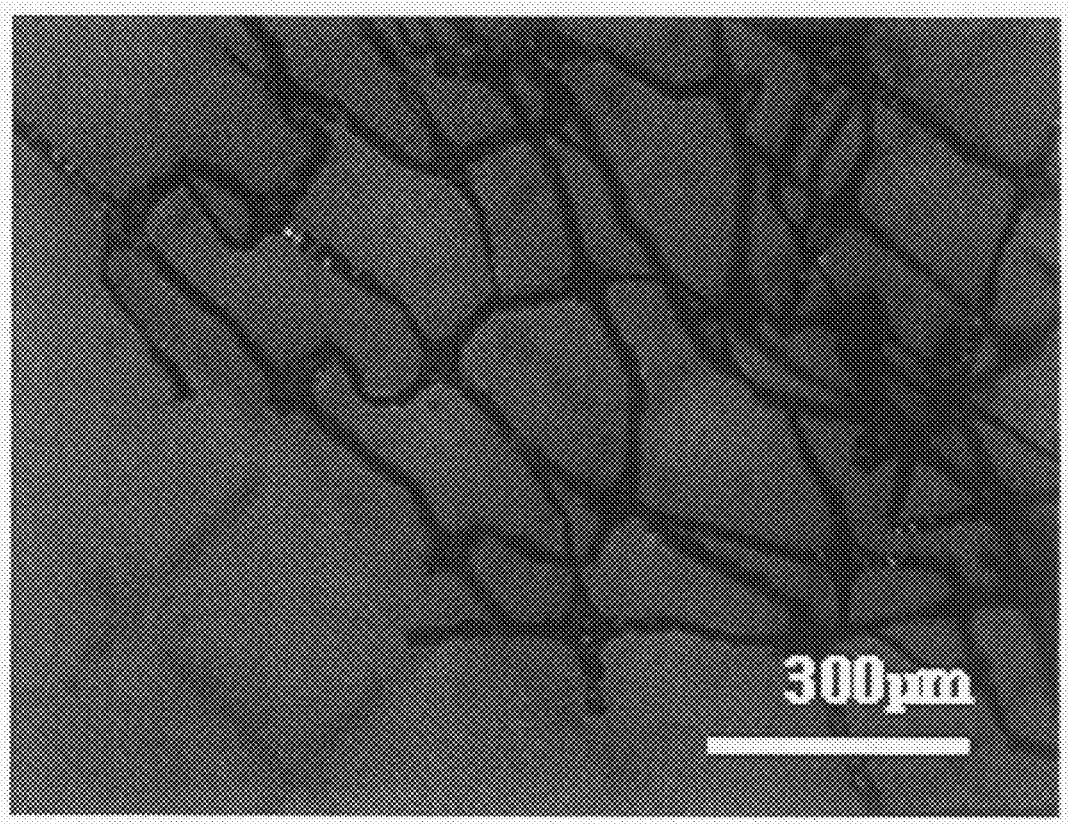
FIG. 8 is an optical micrograph (magnification 50×) of a metal pattern formed in Comparative Example 2 of the present invention.

A fine metal pattern was formed in the same manner as in Example 2, except that no catalyst precursor was used. An optical micrograph (magnification 50x) of the metal pattern is shown in FIG. 8.

Comparative Example 3

1 g of palladium (II) acetate ($PdOAc_2$) was mixed with 1 g of dimethylformamide (DMF) with stirring at room temperature to obtain a mixture. A resin composition was prepared in the same manner as in Example 4, except that the mixture was used as a catalyst for electroless copper plating.

The catalyst was poorly compatible with the organic solvent. In addition, when the catalyst was kneaded with the organic polymer in the organic solvent, phase separation occurred to form a precipitate. As a result, it was impossible to form a pattern of the catalyst.

Comparative Example 4

1 g of palladium (II) acetate ($PdOAc_2$) was mixed with 2.5 g of polyvinylpyrrolidone (PVP, Mw 10,000) with stirring in 10 g of dimethylacetamide (DMAc) at room temperature to prepare a catalyst phase. The catalyst phase was mixed with the organic polymer used in Example 4 in a weight ratio of 2:1 with stirring to prepare a resin composition.

The resin composition was used to form a pattern of the catalyst by the method used in Example 2, but failed to form a uniform coating film. Further, the resin composition was not developed. As a result, it was impossible to form a pattern of the catalyst.

As in Examples 1 to 5, the silver organic complexes were highly compatible with the respective organic polymers and organic solvents. As a result, the patterns were very fine and uniform, and the catalysts were uniformly distributed within the respective patterns. As shown in FIGS. 2 to 6, no peeling was observed during development and plating, and the fine metal patterns were formed within a short time.

The metal patterns formed by UV irradiation were better in quality than those formed by chemical reduction.

The use of the inorganic silver salt in Comparative Example 1 caused peeling of a portion of the patterned layer during development and plating, slow formation of the plating layer due to loss of the catalyst, and low quality of the metal plating layer. In addition, upon electroless plating for a long time, the patterned layer of the catalyst was peeled off.

When no catalyst was used (Comparative Example 2), the plating solution was not plated on the transparent substrate due to very low adsorption of the metal pattern to the substrate.

The catalyst used in Comparative Example 3 was poorly compatible with the organic solvent, and phase separation occurred to form a precipitate when the catalyst was kneaded with the organic polymer. As a result, it was impossible to form a uniform pattern of the catalyst.

Although PVP was added to improve the kneadability in Comparative Example 4, the patterned layer of the catalyst was not uniform and the resin composition was not developed. As a result, it was impossible to form a pattern of the catalyst.

As apparent from the above description, the present invention provides a resin composition comprising a silver organic complex and method for forming metal patterns using the resin composition. A patterned layer of the catalyst formed using the resin composition is highly adhesive, a loss of the catalyst during a wet process, such as development or electroless plating, is substantially prevented, and an increase in plating rate leads to the formation of a uniform, fine metal pattern after electroless plating. The present invention also provides metal patterns formed using the resin composition by the methods. Electromagnetic wave shielding materials comprising the metal patterns can be suitably used in the formation of films for shielding electromagnetic waves generated from the front surface of a variety of displays, including CRTs, PDPs, LCDs and EL displays, and in the wiring of flexible printed circuit boards.

While the present invention has been shown and described in connection with the exemplary embodiments, it will be apparent to those skilled in the art that modifications and variations can be made without departing from the spirit and scope of the invention as defined by the appended claims.

What is claimed is:

1. A resin composition for shielding electromagnetic waves, the resin composition comprising
   an organic polymer resin,
   a polyfunctional monomer having an ethylenically unsaturated bond,
   a photoinitiator,
   a silver fluoride organic complex precursor, and
   an organic solvent.

2. The resin composition according to claim 1, wherein the organic polymer resin is a copolymer of a monomer having a carboxyl group and a monomer copolymerizable with the monomer having a carboxyl group.

3. The resin composition according to claim 2, wherein the monomer having a carboxyl group is selected from the group consisting of acrylic acid, methacrylic acid, crotonic acid, itaconic acid, maleic acid, fumaric acid, monomethylmaleic acid, isoprenesulfonic acid, styrenesulfonic acid, 5-norbornene-2-carboxylic acid, and mixtures thereof.

4. The resin composition according to claim 1, wherein the organic polymer resin has a weight average molecular weight of 2,000 to 30,000.

5. The resin composition according to claim 1, wherein the organic polymer resin has an acid value of 90 to 700 mgKOH/g.

6. The resin composition according to claim 1, wherein the polyfunctional monomer having an ethylenically unsaturated bond is at least one monomer selected from the group consisting of: compounds obtained by esterification of a polyhydric alcohol with an α,β-unsaturated carboxylic acid, including ethylene glycol diacrylate, ethylene glycol dimethacrylate, polyethylene glycol diacrylate having 2 to 14 ethylene groups, polyethylene glycol dimethacrylate having 2 to 14 ethylene groups, trimethylolpropane triacrylate, trimethylolpropane trimethacrylate, pentaerythritol triacrylate, pentaerythritol trimethacrylate, pentaerythritol tetraacrylate, pentaerythritol tetramethacrylate, propylene glycol diacrylate having 2 to 14 propylene groups, propylene glycol dimethacrylate having 2 to 14 propylene groups, dipentaerythritol pentaacrylate, dipentaerythritol pentamethacrylate, dipentaerythritol hexaacrylate and dipentaerythritol hexamethacrylate; compounds obtained by adding acrylic acid or methacrylic acid to a glycidyl-containing compound, including trimethylolpropane triglycidyl ether acrylic acid adducts and bisphenol A diglycidyl ether acrylic acid adducts; and ester compounds of multi-carboxylic acid with a compound having hydroxyl group and ethylenically unsaturated bond or multi-isocyanate adduct of a compound having hydroxyl group and ethylenically unsaturated bond including a phthalate of β-hydroxyethyl acrylate or β-hydroxyethyl methacrylate or a toluene diisocyanate adduct of β-hydroxyethyl acrylate or β-hydroxyethyl methacrylate.

7. The resin composition according to claim 6, wherein the polyfunctional monomer has three or more functional groups having an ethylenically unsaturated bond.

8. The resin composition according to claim 1, wherein the polyfunctional monomer having an ethylenically unsaturated bond is present in an amount of 20 to 150 parts by weight, based on 100 parts by weight of the organic polymer resin.

9. The resin composition according to claim 1, wherein the photoinitiator is selected from the group consisting of acetophenones, benzophenones, Michler's benzoylbenzoate, α-amyloxime ester, thioxanthones, triazines, and mixtures thereof.

10. The resin composition according to claim 1, wherein the photoinitiator is used in an amount of 1 to 25 parts by weight, based on 100 parts by weight of the organic polymer resin.

11. The resin composition according to claim 1, wherein the silver organic complex precursor is a silver fluoride organic complex.

12. The resin composition according to claim 11, wherein the silver fluoride organic complex is selected from the group consisting of silver (I) fluorosulfate, silver (I) trifluoroacetate, silver (I) trifluoromethanesulfate, silver (I) pentafluoropropionate, silver (I) heptafluorobutyrate, 1,5-cyclooctadiene-hexafluoroacetylacetonato silver (I) complex, 1,1,1-trifluoro-2,4-pentadionato silver (I) complex, 5,5-dimethyl-1,1,1-trifluoro-2,4-hexanedionato silver (I) complex, 1-(4-methoxyphenyl)-4,4,4-trifluorobutanedionato silver (I) complex, 5,5,6,6,7,7,8,8,9,9,10,10,11,11,12,12,12-heptadecafluorodecane-2,4-dionato silver (I) complex, 1,1,1,2,2,3,3-heptafluoro-7,7-dimethyl-4,6-octanedionato silver (I) complex, 1,1,1,3,5,5,5-heptafluoropentane-2,4-dionato silver (I) complex, 1,1,1,5,5,5-hexafluoropentane-2,4-dionato silver (I) complex, 5,5,6,6,7,7,8,8,8-nonafluorooctane-2,4-dionato silver (I) complex, 5H, 5H-perfluorononane-4,6-dionato silver (I) complex, 6H,6H-perfluoro-undecane-5,7-dionato silver (I) complex, 8H,8H-perfluoropentadecane-7,8-dionato silver (I) complex, 6H,6H-perfluoroundecane-5,7-dionato silver (I) complex, 1-phenyl-2H,2H-perfluorohexane-1,3-dionato silver (I) complex, 1-phenyl-2H,2H-perfluoroundecane-1,3-dionato silver (I) complex, 5,6,6,6-tetrafluoro-5-(heptafluoropropoxy)hexane-2,4-dionato silver (I) complex, 1,1,5,5-tetrafluoropentane-2,4-dionato silver (I) complex, 5,5,6,6,7,7,8,8,9,9,9-undecanefluoro-nonane-2,4-dionato silver (I) complex, ethyl-3-chloro-4,4,4-trifluoroacetoacetato silver (I) complex, ethyl-4,4-difluoroacetoacetato silver (I) complex, ethyl-4,4,4-trifluoroacetoacetato silver (I) complex, isopropyl-4,4,4-trifluoroacetoacetato silver (I) complex, methyl-4,4,5,5,5-pentafluoro-3-oxopentanonato silver (I) complex, ethyl-4,4,5,5,5-pentafluoro-3-oxo-pentanonato silver (I) complex, 1,1,1,5,5,6,6,6-octafluoro-2,4-hexanedionato silver (I) complex, and mixtures thereof.

13. The resin composition according to claim 1, wherein the silver fluoride organic complex precursor is added in an amount of 2 to 80 parts by weight, based on 100 parts by weight of the total organic solids of the resin composition.

14. The resin composition according to claim 1, wherein the organic solvent is selected from the group consisting of: alcohols, including methanol, ethanol, n-propanol, isopropanol, ethylene glycol and propylene glycol; ketones, including acetone, methyl ethyl ketone, cyclohexanone and n-methyl-2-pyrrolidone; aromatic hydrocarbons, including toluene, xylene and tetramethylbenzene; glycol ethers, including cellosolve, methyl cellosolve, ethyl cellosolve, 3-methoxypropyl acetate, propylene glycol monomethyl ether, propylene glycol ethyl ether, dipropylene glycol monomethyl ether and dipropylene glycol ethyl ether; acetates, including ethyl acetate, butyl acetate, cellosolve acetate, ethyl cellosolve acetate, butyl cellosolve acetate, propylene glycol monomethyl ether acetate and propylene glycol ethyl ether acetate; and mixtures thereof.

15. The resin composition according to claim 1, further comprising 10 parts by weight or less of a photosensitizer, based on 100 parts by weight of a mixture of the organic polymer resin and the photoinitiator.

16. The resin composition according to claim 15, wherein the photosensitizer is selected from the group consisting of n-butylamine, triethylamine, tri-n-butylphosphine, and mixtures thereof.

17. A method for forming a metal pattern, the method comprising
coating the resin composition according to claim 1 on a substrate,
exposing the coated composition to light and developing the exposed composition to form a patterned layer of a catalyst,
reducing the patterned layer, and
subjecting the reduced layer to electroless plating.

18. A method for forming a metal pattern, the method comprising
forming a patterned layer of a catalyst on a substrate with the resin composition according to claim 1,
reducing the patterned layer, and
subjecting the reduced layer to electroless plating.

19. The method according to claim 18, wherein the forming a patterned layer of the catalyst is performed by offset printing, inkjet printing, imprinting, or screen printing.

20. The method according to claim 17 or 18, wherein the substrate is selected from the group consisting of glass substrates, and plastic sheets and films made of polycarbonate, acrylic resins, PET, triacetyl cellulose (TAC), polyvinyl chloride resins, polyamide resins and polyimide resins.

21. The method according to claim 17 or 18, wherein the reduction is carried out using sodium borohydride or ascorbic acid as a reducing agent.

22. The method according to claim 17 or 18, wherein the reduction is carried out by UV irradiation and/or heat.

23. The method according to claim 17 or 18, wherein the electroless plating is carried out by copper or silver plating.

24. The method according to claim 23, wherein the copper plating is carried out using a plating solution containing copper sulfate as a metal ion salt, formalin as a reducing agent and EDTA as a stabilizer.

25. A metal pattern formed by a method comprising coating the resin composition according to claim 1 on a substrate, exposing the coated composition to light and developing the exposed composition to form a patterned layer of the catalyst, reducing the patterned layer, and subjecting the reduced layer to electroless plating.

26. A metal pattern formed by a method comprising forming a patterned layer of a catalyst on a substrate with the resin composition according to claim 1, reducing the patterned layer, and subjecting the reduced layer to electroless plating.

27. An electromagnetic wave shielding material comprising the metal pattern according to claim 25 or 26.

\* \* \* \* \*